United States Patent
Mneimneh et al.

(10) Patent No.: US 8,448,111 B2
(45) Date of Patent: May 21, 2013

(54) SYSTEM AND METHOD FOR METASTABILITY VERIFICATION OF CIRCUITS OF AN INTEGRATED CIRCUIT

(75) Inventors: Maher Mneimneh, San Jose, CA (US); Shaker Sarwary, San Diego, CA (US); Paras Mal Jain, Rajasthan (IN); Ashish Bansal, New Delhi (IN); Mohammad Movahed-Ezazi, Saratoga, CA (US); Namit Gupta, San Jose, CA (US)

(73) Assignee: Atrenta, Inc., San Jose, CA (US)

( * ) Notice: Subject to any disclaimer, the term of this patent is extended or adjusted under 35 U.S.C. 154(b) by 0 days.

(21) Appl. No.: 12/986,644

(22) Filed: Jan. 7, 2011

(65) Prior Publication Data
US 2012/0180015 A1 Jul. 12, 2012

(51) Int. Cl.
*G06F 17/50* (2006.01)
(52) U.S. Cl.
USPC .................. 716/108; 716/113; 716/134
(58) Field of Classification Search
USPC .................. 716/108, 113, 134
See application file for complete search history.

(56) References Cited

U.S. PATENT DOCUMENTS

| | | | |
|---|---|---|---|
| 5,889,677 A | 3/1999 | Yasuda et al. | |
| 7,073,146 B2 | 7/2006 | Sarwary et al. | |
| 7,082,584 B2* | 7/2006 | Lahner et al. | 716/102 |
| 7,139,988 B2* | 11/2006 | Chard et al. | 716/108 |
| 7,143,375 B2 | 11/2006 | Maruyama et al. | |
| 7,243,322 B1* | 7/2007 | Ly et al. | 716/108 |
| 7,289,946 B1* | 10/2007 | Lee | 703/16 |
| 7,333,926 B2* | 2/2008 | Schuppe | 703/15 |
| 7,337,414 B2 | 2/2008 | Maruyama et al. | |
| 7,441,213 B2 | 10/2008 | Lehner et al. | |
| 7,506,292 B2 | 3/2009 | Sarwary et al. | |
| 7,509,292 B2 | 3/2009 | Walmsley | |
| 7,536,662 B2 | 5/2009 | Sarwary et al. | |
| 7,562,266 B2 | 7/2009 | Hosono | |
| 7,665,059 B2* | 2/2010 | Czeck et al. | 716/104 |
| 7,712,062 B2* | 5/2010 | Ly et al. | 716/106 |
| 2008/0134115 A1* | 6/2008 | Ly et al. | 716/5 |

\* cited by examiner

*Primary Examiner* — Naum Levin
(74) *Attorney, Agent, or Firm* — Sughrue Mion, PLLC

(57) ABSTRACT

A method and system for metastability verification of an integrated circuit design are provided. An IC design is received and the source-to-destination paths of the IC design are determined. For each of the determined source-to-destination paths, it is determined whether the corresponding source is synchronized. For each source its respective synchronized or unsynchronized result is stored and a report is generated for each source describing whether it is synchronized or unsynchronized.

10 Claims, 3 Drawing Sheets

SYSTEM AND METHOD FOR METASTABILITY VERIFICATION OF CIRCUITS OF AN INTEGRATED CIRCUIT

BACKGROUND OF THE INVENTION

1. Field of the Invention

Apparatuses and methods consistent with the present invention relate to the field of circuit design verification and in particular integrated circuit design verification. More particularly, the disclosed apparatuses and methods relate to a method for metastability verification of circuits of an integrated circuit.

2. Description of the Related Art

Today's system on a chip (SoC) size, timing, and power requirements cannot be met under traditional synchronous clocking methodologies where a single clock controls all memory elements. While controlling an integrated circuit (IC) with multiple clocks helps in meeting those requirements, the asynchronous nature of the clocks brings about new challenges. Signals transmitted asynchronously from one clock domain to another do not have a predictable timing and therefore violate timing requirements that are easily met in synchronous interfaces. Analysis and verification of asynchronous interfaces for correct synchronization mechanisms in such designs are becoming an essential part of SoC design flows. Neglecting this aspect of verification, often leads to chip failure. This is now handled by a verification step known as clock domain crossing (CDC) verification. Prior art solutions and products attempt to address this verification need, however, CDC verification remains a challenge to designers due to many limitations of the conventional solutions.

Several challenges must be addressed in order to be able to provide an effective solution. The first challenge has to do with the large amount of false violations. This is also known as the noise problem. Many verification tools generate large number of violations that are not real design problems. These violations are often due to the lack of in-depth analysis of the design resulting in identification of unsynchronized clock domain crossings while in fact the crossing is synchronized. Designers have to review thousands, tens of thousands or even hundreds of thousands of violations to identify the few real design problems. The second challenge involves missing real design bugs due to a large amount of violations and an inability to distinguish problematic ones. One approach involves the generation of a heuristic report that is a subset of potential problems causing some real design issues to be masked and therefore leading to real IC failures. The third challenge involves hard-to-debug violations. Lack of in-depth analysis of crossings and synchronization mechanisms result in superficial report of a design defect, leaving the user with little hint on determining the root cause of a problem and deciding how to fix the problem.

These shortcomings are mainly due to superficial structural analysis of the design which tends to generate false violations as well as mask real design bugs. For example, a FIFO, recognized on the basis of a memory and some control logic and corresponding clock domain crossings, maybe reported as synchronized regardless of whether asynchronous events are stopped by the control structure or not, and regardless of whether asynchronous glitches can propagate through the enable structure or not.

Synchronization circuitry is often verified with a variety of static and dynamic approaches. Typical static verification consists of design structure analysis targeted at identifying elements of a typical synchronization circuit such as a multi-flop synchronizer circuit on a control crossing. Such approaches are very convenient and fast as they rely on simple design traversal techniques. However, these approaches suffer from the shortcomings listed in the introduction section, such as high number of false violations.

There has been little research in solving synchronization verification and typically ad-hoc solutions addressing specific synchronization structures are provided. For example, U.S. Pat. No. 7,536,662 assigned to the current assignee, addresses such a specific case, and provides a method to recognize FIFO structures in a design. However, there are at least two scenarios not covered by this approach. In the first, the read/write pointer logic can be implemented using different styles. Traditionally it is implemented through counters or incrementers. However, other implementations based on shift registers with one active token are possible. The techniques for recognizing the FIFO in this case have to be enhanced to address this new style of read/write pointers. Since designers can always come up with new approaches to implementing the read/write pointer logic, a verification approach based solely on using structural recognition of FIFOs will not suffice. Another example is the case where the ratio of the clock domains is known and users decide to skip the empty and full flags which are essential to the recognition scheme used. Removing these flags makes the approach unsuitable for synchronization verification.

U.S. Pat. Nos. 7,506,292 and 7,073,146, both assigned to the current assignee, target the data hold problem only, and the method provided is not suitable for large designs as they are performing functional verification of a large part of the design which may not be needed to guarantee correctness of synchronization structures. The approaches consider a clock domain crossing as an individual flop to flop path and ignore the overall architecture of data crossings that would help in better understanding and effectively verifying the clock domain crossings. To illustrate this further, U.S. Pat. No. 7,509,292 considers a crossing as synchronized if a change at the source register and a change at the destination register of the crossing do not take place at the same time. However, in most designs there are multiple sources in the crossing. It is not sufficient to check that these two conditions do not occur at the same time. For example, although a destination changes at the same time that source S1 changes, it might be correctly loading the value of another source S2, with correct synchronization. Thus the condition described above is sufficient but not necessary for a crossing to be synchronized.

There is a need for comprehensive and systematic approach to verifying synchronization systems that leads to a robust result. As prior art solutions are point solutions where a FIFO structure or a handshake circuitry is identified using a-priori understanding of these structures, it would be advantageous to provide a generic recognition approach with improved performance. The solution should also overcome failures of prior art solutions due to simple modification to the structures as well as generation of new structures that combine these simple ones as building blocks.

SUMMARY

Exemplary implementations of the present invention address at least the above problems and/or disadvantages and other disadvantages not described above. Also, the present invention is not required to overcome the disadvantages described above, and an exemplary implementation of the present invention may not overcome any of the above disadvantages.

According to an exemplary implementation, a method is provided for metastability verification of an integrated circuit design. According to the method, an IC design is received and the source-to-destination paths of the IC design are determined. For each of the determined source-to-destination paths, it is determined whether the corresponding source is synchronized. For each source its respective synchronized or unsynchronized result is stored and a report is generated for each source describing whether it is synchronized or unsynchronized.

A system and computer-readable storage medium for metastability verification of an integrated circuit design are also provided.

BRIEF DESCRIPTION OF THE DRAWINGS

The above and/or other aspects of the present invention will be made more apparent by describing certain exemplary implementations of the present invention with reference to the accompanying drawings, in which.

DETAILED DESCRIPTION OF EXEMPLARY IMPLEMENTATIONS

Figure 1:
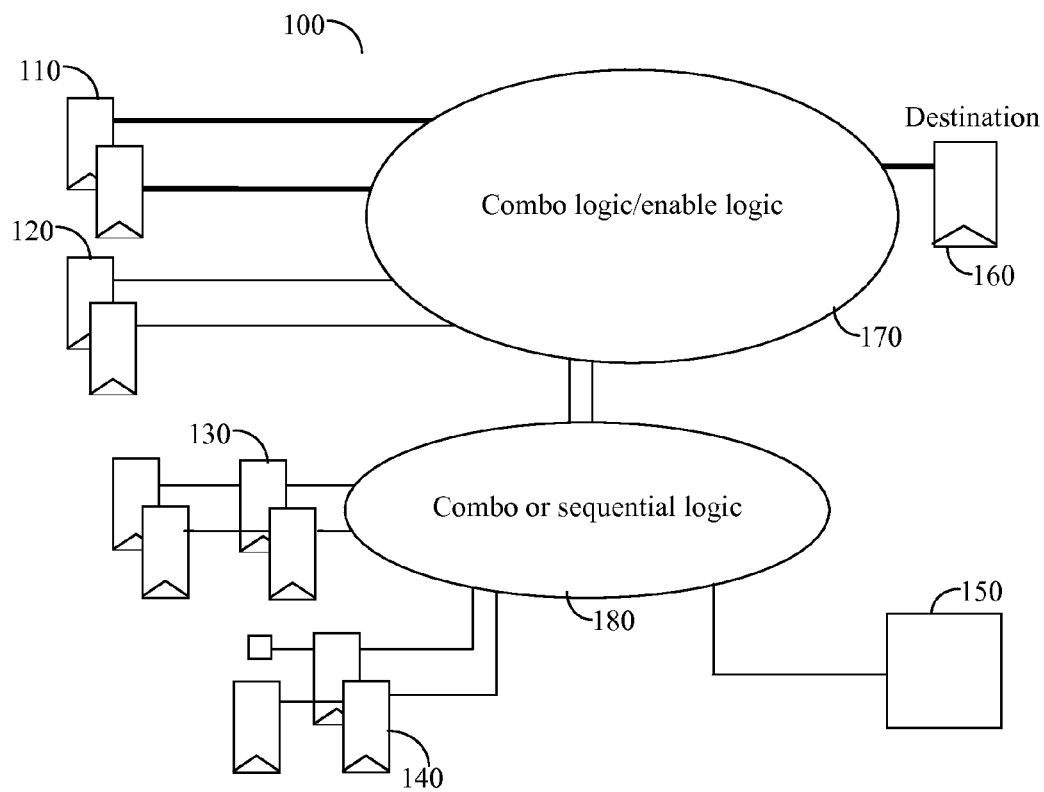
FIG. 1 illustrates an integrated circuit with different clock domain crossings.

Certain exemplary implementations of the present invention will now be described in greater detail with reference to the accompanying drawings.

In the following description, like drawing reference numerals are used for like elements, even in different drawings. The matters defined in the description, such as detailed construction and elements, are provided to assist in a comprehensive understanding of the invention. However, the present invention can be practiced without those specifically defined matters. Also, well-known functions or constructions are not described in detail since they would obscure the invention with unnecessary detail.

The requirements from a modern integrated circuit (IC) cannot be met under traditional synchronous clocking methodologies where a single clock controls all memory elements and therefore multiple clocks are used which brings about challenges due to their asynchronous nature. Therefore the exemplary method described herein combines a comprehensive structural analysis to isolate the synchronization logic within few gates and perform verification around this logic to address both data stability and glitch concerns across clock domains. The functional conditions presented describe the necessary and sufficient conditions under which a crossing, that can involve multiple sources, is synchronized. This method is a more practical approach for real complex designs with generic recognition and generation that further provide an improved performance.

To better understand the issues relating to the present disclosure, reference is now made to FIG. 1, that illustrates an exemplary and non-limiting diagram 100 of different clock domain crossings in an IC. Clock domain crossings are rarely a single flip-flop (FF) to FF path. Rather, they usually involve one or multiple multi-bit data lines, possibly a multi-bit address line, one or multiple single-bit control signals coming from the same source, as well as additional logic from the destination domain. In this scheme FFs may be explicit FFs or inputs or internal signals declared in the given domain.

A clock domain crossing is synchronized if both data stability and glitch prevention logic are honored on the crossing. Though these requirements are purely functional requirements, it is not always possible, nor easy, to enforce and verify the functionality given just the source and destination of a crossing. Therefore, in accordance with the principles of the present disclosure a combined set of structural and functional checks verify both stability and glitch issues. This approach is of particular relevance for large designs of ICs since the exemplary method presented herein has reasonable run time and memory requirements.

The exemplary method consists of enforcing three types of requirements: sources/synchronizers requirements, i.e., requirements on the domains and structures of signals in elements 110, 120, 130, 140 and 150 shown in FIG. 1; requirements regarding "Combo Logic/Enable Logic" 170; and functional requirements.

Figure 2:
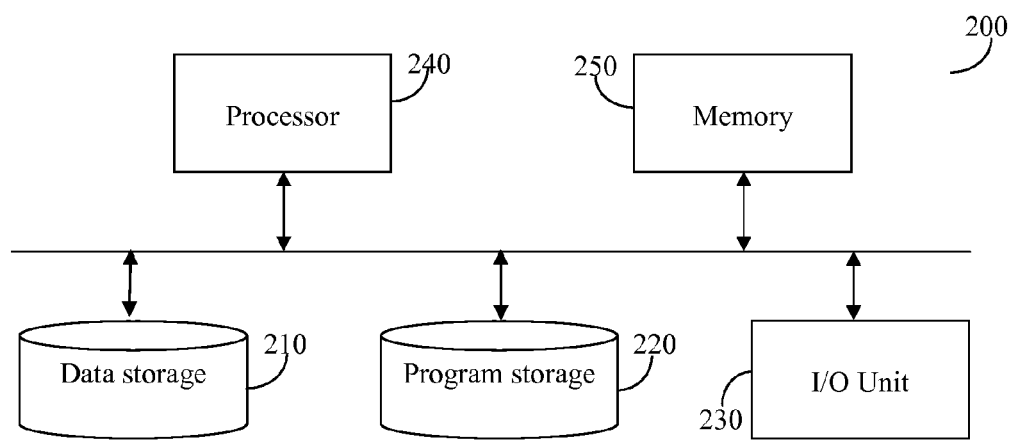
FIG. 2 illustrates an exemplary system for metastability verification.

The overall validation process is controlled by a user of the exemplary system described in greater detail with respect of FIG. 2, having two use models. The first use model involves structural analysis. The structural analysis step includes checking the first and second requirements discussed above. The analysis for these two requirements is generally very fast. Any crossing meeting these requirements has elements of a synchronizer that indicates the user has thought about synchronizing the path. The crossing may still present data hold or glitch risks as the functionality of the path has not been verified. Some designers with limited time for clock-domain crossing (CDC) verification may chose to look at issues reported by this type of structural analysis. In this case, users can conclude the analysis after this step. The structural step analyzes the architectural semantics of the crossings by identifying all the sources and the synchronizers and their relationship to a destination point. No prior art CDC solution performed this global analysis of the clock-domain crossing to understand how the sources and qualifiers interact on the crossing. In fact, most prior art solutions assume simple textbook synchronization approaches that result in missing other sources and missing situations where a set of synchronizers delayed by several layers of FFs can correctly transfer data to a destination.

The second use model involves functional analysis. To guarantee correctness of the synchronizer, the third requirement is verified on the crossing which provides a proof of correctness with regard to data-hold as well as glitch. This can be used in a flow where CDC verification signoff is required. The functional step analyzes the crossing structure using functional approaches to further refine the results of structural analysis by certifying whether the synchronizers correctly transfer the source data when they are active, and block this data when they are inactive. Prior art solutions have not identified a complete set of conditions that can safely classify a crossing as synchronized or unsynchronized from a functional standpoint.

Returning to FIG. 1, four types of start-points, denoted as Type A start-point through Type D start-point are defined. Type A start-point involve multi-bit (Type A1) FFs 110 and single-bit (Type A2) FFs 120, as well as primary inputs, and black-boxes directly in the fan-in of the destination 160 whose clock is in a domain different from that of the source FFs 110 and 120. Type B start-point includes double-flop/ sync-cell single bit or multi-bit start-points (layers of FFs 130 allowed), and unsynchronized start-points from the same source clock domain as an element of Type A start-point (layers of FFs allowed). Type C start-point includes other drivers of the enable logic that do not have domain information or are from destination clock domain such as: FFs 140 in the destination clock domain that do not belong to Type B start-point. This includes FFs that are destinations of start-points where the source of these start-points are not in Type A start-points. Type C start-point further includes primary inputs and black-box outputs (PI/BB), like element 150, whose clock domain is either undefined or equal to that of the destination. The last is Type D start-point which includes qualifier signals specified with a qualifier constraint. It should be noted that to consider a start-point from a source domain of a Type A start-point as synchronized, there must be a corresponding synchronizer of Type B or Type D start-point.

A person of ordinary skill in the art would appreciate that two or more signals in Type A start-point may have different clock domains. Such a start-point is OK if for each source clock domain in Type A start-point there is a corresponding element in the group of {Type B start-point, Type D start-point} that synchronizes them. Also, for a bus where some bits are synchronized with one qualifier, some other bits synchronized with another qualifier, and furthermore some bits maybe not synchronized at all, the exemplary method described herein splits the source of Type A start-point into individual bus bits buckets for each one of the identified Types. Thus, to claim that a destination is synchronized, all its sources must be synchronized too. The recognition of Type A start-point through Type D start-point described above is achieved by using graph algorithms that are linear in size to that of the designs. This guarantees very efficient time and memory performance for multi-million gate designs of ICs.

It should be further noted that the presence of Type B start-point or Type D start-point alone cannot guarantee synchronization against metastability. The enable logic, represented as "combo logic" 180 in FIG. 1, must be such that when the qualifier is in-active, all paths from the source, e.g., source 130, to the destination 160 must be blocked. Therefore, only a good qualifier combined with proper data and enable sequencing can guarantee the correctness of the clock domain crossings. The condition can be further described as follows: Type B start-point or type D start-point is an enabling condition for combo logic 180 bringing Type A start-point into the destination 160; and, Type A start-point is stable when Type B start-point or Type D start-point is active. In addition, the combo logic is assumed to be glitch free. According to the principles of the present disclosure the combo logic 170 may be one of the following: recirculation multiplexer (mux) with qualifier feeding the enable/mux-select and possible logic on data path before and after the mux; AND gate present anywhere as long as corresponding signals from Type B start-point or Type D start-point are also feeding the AND gate possibly through other logic; and, complex/random logic. Random logic is only optionally accepted after checking that: two signals from Type A start-point that are in two different clock domains cannot converge before they are qualified by their respective qualifiers; and, a signal from Type A start-point cannot converge with a qualifier from another domain before it is qualified by its own qualifier.

With the above structural analysis, the exemplary method enforces that a designer has thought of proper structures around the Type A start-points of the design. However, this may not be sufficient to guarantee that no metastability will be caused by these structures. Additional functional checks are applied to enforce functional correctness and provide a guarantee against metastability. First, there is a data-hold check; when the signal from Type B or Type D start-points is active, the sources it synchronizes do not change value. This enforces data hold relationship between the qualifier and the source data. It is a generalized form of data sequencing that is usually applied to order the request and acknowledge in a handshake protocol. Second, there is an enable-check; when the signal from Type B or Type D start-point is de-asserted, the path from the source to the destination is blocked. This enforces the correctness of enabling logic for destination FF 160. To make sure glitches are also covered, the actual check will enforce that there is no active paths from the source to destination when the qualifier, a signal of Type B or Type D start-points, is inactive. Note that the qualifier may be behind sequential logic and the functional check accounts for the cycles needed for a qualifier to cross the sequential logic and reach the enabling combo logic.

FIG. 2 illustrates an exemplary and non-limiting system 200 for metastability verification. The system 200 may be a portion of a computer aided design (CAD) system (not shown). A data storage unit 210 contains at least the IC design. A program storage 220 contains at least a plurality of programs that perform the method discussed in with respect of FIG. 3 below. In an exemplary implementation anyone of the storage units 210 and 220 may be remote to the system 200 and accessed over a network (not shown). An input/output interface unit (IOU) 230 enables the system 200 to communicate over an interface such as a network with other devices, including but not limited to a user display (not shown), a keyboard (not shown) and other peripheral elements, as are commonly used by those of ordinary skill in the art. The IOU 230 may be used by a designer to load programs into the program storage 220 or to load the IC design and other necessary or related files of an IC into data storage 210. It should be appreciated that in an exemplary implementation the storage units 210 and 220 are a single storage, while in other exemplary implementations a plurality of storage units may be used, each containing other portions needed for the proper operation of the system 200. A processor 240 and a memory 250 are further used to execute a management program stored in the program storage 220 and performing at least the functions discussed with respect to FIG. 3 below. The processor 240 executes instructions stored in program storage 220 for processing the IC design stored in data storage 210, and further uses the memory 250 as a memory for holding temporary results of the processing.

Figure 3:
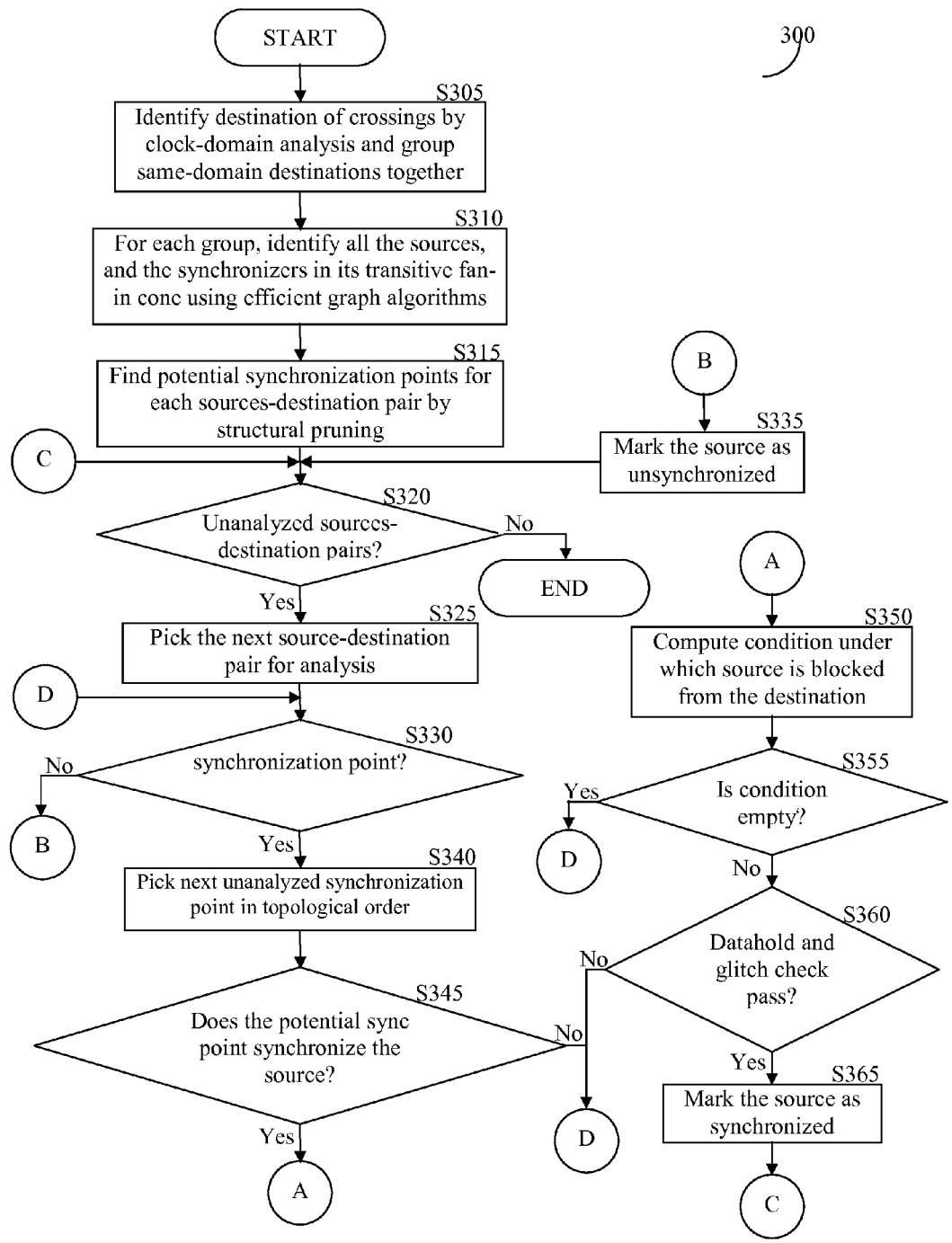
FIG. 3 illustrates an exemplary method for metastability verification.

Reference is now made to FIG. 3, which illustrates a flowchart 300 describing the flow for metastability verification in accordance with an exemplary implementation of the present disclosure. In S305 user-defined clocks and their corresponding domains are propagated and FFs are labeled with their corresponding clock domains. A destination is a FF whose labeling is different from that of a FF in its fan-in. Destinations are partitioned by their label such that two destinations are in the same group if they have the same label. In S310 sources and synchronizers are identified for each partition group computed above by, for example, efficient graph traversal algorithms. Deep synchronizers, that exist after large number of sequential FF layers, are also identified in this step. Typically, algorithms used are those that guarantee linear runtime in the size of the designs being analyzed, to ensure efficient usage of compute resources, such as in the system described with respect of FIG. 2. In S315, for each of the sources identified in S310, potential synchronization points for the source-destination pair at hand are computed by structural pruning. These are points that are sufficient to guarantee that a source is synchronized. This computation is part of the enable condition requirements we defined in the previous section. A synchronization point refers to the logic that allows two signals from different clock domains to be synchronized.

In S320 the operation of an iterative process is performed to ensure that all the source-destination pairs are checked, and once done execution completes; otherwise, execution continues with S325. For each source-destination pair, it is checked if there is a synchronization point by selecting in S325 the next source-destination pair. If there are no synchronization points, then the start-point (and therefore the source-destination pair) is unsynchronized and execution continues with S335 where the source is marked as being unsynchronized. Otherwise, the next unanalyzed synchronization point is picked in S340 in topological order. In S345 it is checked if the synchronization point structurally synchronizes the start-point according to the enabling requirements described in greater detail hereinabove. If it does not structurally synchronize the start-point, then execution continues with S330; otherwise, execution continues with S350 where the functional requirements are verified. To verify the functional requirements the condition under which the source is blocked from the destination are computed. In S355 it is checked if this condition is empty and if so execution continues with S330; otherwise, execution continues with S360 where data hold and glitch checks are performed. If these checks hold, then in S365 the start-point is marked as synchronized and execution continues with S320. As noted above the method terminates once all the source-destination pairs are analyzed. In an exemplary implementation a report is generated containing all the sources marked as synchronized and all the sources marked as unsynchronized, the report being stored in memory, for example data storage 210.

Figure 4:
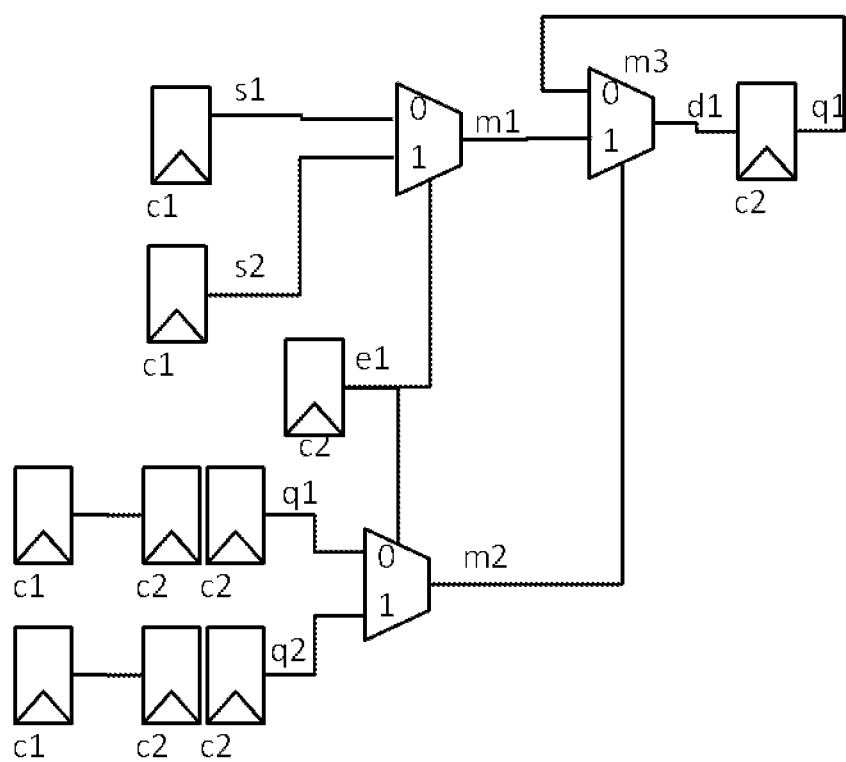
FIG. 4 is a circuit diagram illustrating the operation of the metastability verification.

In simple situations, the enable condition depends on a single qualifier. However, in complex designs, this condition is a complex function of multiple qualifiers and destination signals. The method described herein formally computes the correct enable condition that transfers and blocks the data. This complex enable condition is the one that is used to perform the data-hold and enable checks described above. An exemplary and non-limiting illustration of the operation of functional analysis on a circuit is provided with respect of the exemplary and non-limiting FIG. 4. Two source s1 and s2 (type-A start points) are synchronized by two qualifiers q1 and q2 (type-B start points). Notice that the structural analysis performed will identify s1 and s2 as potentially synchronized since there is a qualifier q1/q2 in the fan-in cone of the enable that is "structurally" synchronizing the start-point. However, this analysis is not sufficient to guarantee correct operation. Applying the prior art approaches will not work as the destination q1 might change due to s2 while s1 is also changing. To correctly analyze the above start-point the disclosed method identifies the functional conditions under which each source is transferred to or blocked from the destination. This functional analysis is performed using formal analysis techniques that derive a condition under which changes in a given source are not seen at the destination. For example, for source s1, there are two conditions under which this source is blocked from the destination:

$$e1=1 \tag{1}$$

$$e1=0, q1=0 \tag{2}$$

It should be noted that e1 corresponds to a type-C start point. Similarly two blocking conditions for the second source s2 are identified in accordance with the principles of the invention. It is possible that during the above computation no blocking condition for a given source is found. In this case the immediate conclusion is that the source is unsynchronized since the transfer from the source takes place at all times. If the blocking condition exists, it is used to guarantee the correct operation of the synchronization. As previously mentioned, two checks are performed. The first check verifies that whenever the blocking condition is false, i.e., data is transferred from the source, the source is not changing. For s1, this reduces to verifying the property:

$$(e1=0 \text{ AND } q1=1) => \text{stable}(s1) \tag{3}$$

The above property can be verified using various formal verification techniques. The second check verifies that whenever the blocking condition is true, there are no dynamic glitches that can reach from the source to the destination. Although the above technique is illustrated on a simple circuit, its principles are applicable to highly complex crossings with multiple sources and synchronizers, according to the method described with respect to FIG. 3 above. One example is crossings that involve multiple FIFOs, handshake and control logic from the destination domain.

The exemplary implementations described above may be implemented as hardware, firmware, software or any combination thereof, including but not limited to a CAD system and software products thereof, the software designed to execute on an appropriate apparatus for execution of the plurality of instructions that are contained in the software. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit and/or display unit.

It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer special purpose computer or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium or more specifically a computer readable storage medium that can direct a computer, or other programmable data processing apparatus, or other devices to function in a particular manner, such that the instructions stored in the computer readable medium produce an article of manufacture including instructions which implement the function/act specified in the flowchart and/or block diagram block or blocks.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and implementations of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for metastability verification of an integrated circuit design (IC), the method comprising:
   receiving an IC design from a data storage of a computer aided design (CAD) system;
   determining at least a source-to-destination path of the IC design;
   determining by structural pruning potential synchronization points for each of the two or more sources of the sources-destination;
   determining for the at least a source-to-destination path whether each of the corresponding source is synchronized respective of the potential synchronization points;
   storing in the data storage for each source its respective synchronized or unsynchronized result; and
   providing a report of each source determined to be synchronized and each source determined to be unsynchronized.

2. The method of claim 1, wherein determining the source-to destination paths comprises:
   identifying destinations by clock-domain analysis; and
   grouping together destinations corresponding to the same clock-domain into respective same-domain groups.

3. The method of claim 2, further comprising:
   identifying each source corresponding to each of the destinations in the same-domain groups; and
   identifying synchronizers in the same domain-group which are in transitive fan-in cones.

4. The method of claim 3, wherein identifying synchronizers comprises using at least a graph algorithm of linear-time complexity.

5. The method of claim 1, wherein the structural pruning comprises using a graph algorithm of linear-time complexity.

6. The method of claim 1, wherein determining for each source-to-destination path whether the source is definitely synchronized or definitely unsynchronized comprises:
   marking a source as unsynchronized if no synchronization points are found for the source.

7. The method of claim 1, wherein determining for each source-to-destination path whether the source is definitely synchronized or definitely unsynchronized comprises:
   marking a source as synchronized if the source passes a data hold and glitch check.

8. The method of claim 7, wherein the data hold and glitch check are performed upon determination that a condition under which the source is blocked from the destination is met.

9. The method of claim 8, wherein the condition under which the source is blocked from the destination is checked for each potential synchronization point identified.

10. A non-transitory computer readable medium having stored thereon instructions for causing one or more processing units to execute the method according to claim 1.

* * * * *